(12) United States Patent
Akabori et al.

(10) Patent No.: US 9,743,030 B2
(45) Date of Patent: Aug. 22, 2017

(54) DRIVING METHOD FOR IMAGE PICKUP APPARATUS, AND IMAGE PICKUP APPARATUS

(71) Applicant: CANON KABUSHIKI KAISHA, Tokyo (JP)

(72) Inventors: Hiroo Akabori, Fujisawa (JP); Koichiro Iwata, Kawasaki (JP); Hiroyuki Morita, Ebina (JP); Shinichiro Shimizu, Tokyo (JP); Daisuke Inoue, Ebina (JP); Kazuki Ohshitanai, Kawasaki (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/965,185

(22) Filed: Dec. 10, 2015

(65) Prior Publication Data
US 2016/0173799 A1    Jun. 16, 2016

(30) Foreign Application Priority Data

Dec. 16, 2014   (JP) .................................. 2014-254582
Nov. 24, 2015   (JP) .................................. 2015-229180

(51) Int. Cl.
*H04N 5/378*    (2011.01)
*H04N 5/369*    (2011.01)
(Continued)

(52) U.S. Cl.
CPC ....... *H04N 5/378* (2013.01); *H01L 27/14623* (2013.01); *H04N 5/345* (2013.01);
(Continued)

(58) Field of Classification Search
CPC .... H04N 5/23212; H04N 5/341; H04N 5/343; H04N 5/345–5/3454; H04N 5/359; H04N 5/3541; H04N 5/3594; H04N 5/3595; H04N 5/365; H04N 5/3651; H04N 5/3653; H04N 5/3696; H04N 5/374; H04N 5/378; H04N 5/3765; G02B 7/34; G02B 7/346
See application file for complete search history.

(56) References Cited

U.S. PATENT DOCUMENTS 7,244,921 B2    7/2007   Mabuchi
7,956,925 B2    6/2011   Ogawa
(Continued)

FOREIGN PATENT DOCUMENTS

EP          2375729 A2      10/2011
JP       2010-074243 A       4/2010
(Continued)

*Primary Examiner* — Paul Berardesca
(74) *Attorney, Agent, or Firm* — Canon USA, Inc. IP Division

(57) ABSTRACT

A pixel portion includes a plurality of first pixel rows and a plurality of second pixel rows each being arranged so as to be adjacent to the first pixel row. Among the first pixel row and the second pixel row arranged so as to be adjacent to each other, during at least a part of a period from an end of the electric charge accumulation period in the second pixel row until an end of an output period in which signals from pixels in the first pixel row are output, electric charges accumulated in photoelectric conversion units of pixels in the second pixel row are reset.

20 Claims, 12 Drawing Sheets

(51) Int. Cl.
  *H04N 5/345*    (2011.01)
  *H04N 5/355*    (2011.01)
  *H01L 27/146*   (2006.01)
  *H04N 5/376*    (2011.01)

(52) U.S. Cl.
  CPC ....... *H04N 5/35572* (2013.01); *H04N 5/3696* (2013.01); *H04N 5/3765* (2013.01)

(56) References Cited

U.S. PATENT DOCUMENTS

| | | |
|---|---|---|
| 8,203,634 B2 | 6/2012 | Mabuchi |
| 2007/0273785 A1 | 11/2007 | Ogawa |
| 2008/0055439 A1 | 3/2008 | Mabuchi |
| 2009/0135273 A1* | 5/2009 | Kusaka .............. H04N 5/23212 348/222.1 |
| 2009/0180014 A1 | 7/2009 | Noda |
| 2010/0194922 A1* | 8/2010 | Honda ............... H04N 5/23245 348/231.99 |

FOREIGN PATENT DOCUMENTS

| | | |
|---|---|---|
| RU | 2182405 C2 | 5/2002 |
| RU | 2496251 C2 | 10/2013 |
| WO | 2011/016897 A1 | 2/2011 |

* cited by examiner

DRIVING METHOD FOR IMAGE PICKUP APPARATUS, AND IMAGE PICKUP APPARATUS

BACKGROUND OF THE INVENTION

Field of the Invention

The present invention relates to a configuration in which signals are collectively read out for each pixel group in an image pickup apparatus including a plurality of pixel groups.

Description of the Related Art

An image pickup apparatus has been proposed in which a pixel group constituted by image pickup pixel rows and a pixel group constituted by focus detection pixel rows are provided on an image pickup surface, and respective signals are read out. As an example of the above-described image pickup apparatus, Japanese Patent Laid-Open No. 2010-074243 describes an image pickup apparatus in which the image pickup pixel rows are collectively scanned while skipping the focus detection pixel rows, and thereafter, the focus detection pixel rows are collectively scanned.

SUMMARY OF THE INVENTION

An image pickup apparatus according to an aspect of the present invention includes a pixel portion where a plurality of pixels each including a photoelectric conversion unit are arranged in a matrix and outputs signals based on electric charges generated in electric charge accumulation periods by sequentially scanning the pixel rows while the electric charge accumulation periods of the respective pixels are controlled by an electronic shutter operation, in which the pixel portion includes a first pixel group including a plurality of first pixel rows and a second pixel group including a plurality of second pixel rows each being arranged so as to be adjacent to the first pixel row, the electric charge accumulation periods of the first pixel row and the second pixel rows which are arranged so as to be adjacent to each other are controlled in a manner that, after the electric charge accumulation periods of the respective photoelectric conversion units included in one pixel row are ended, the electric charge accumulation periods of the respective photoelectric conversion units included in the other pixel row are started, signals in the plurality of first pixel rows and signals in the plurality of second pixel rows are output by sequentially scanning the plurality of second pixel rows of the second pixel group after the plurality of first pixel rows of the first pixel group are sequentially scanned, and among the first pixel row and the second pixel rows which are arranged so as to be adjacent to each other, during at least a part of a period from an end of the electric charge accumulation period in the second pixel row until an end of an output period in which signals of the pixels in the first pixel row is ended, the electric charges accumulated in the photoelectric conversion units of the pixels in the second pixel row are reset.

Further features of the present invention will become apparent from the following description of exemplary embodiments with reference to the attached drawings.

DESCRIPTION OF THE EMBODIMENTS

Figure 1:
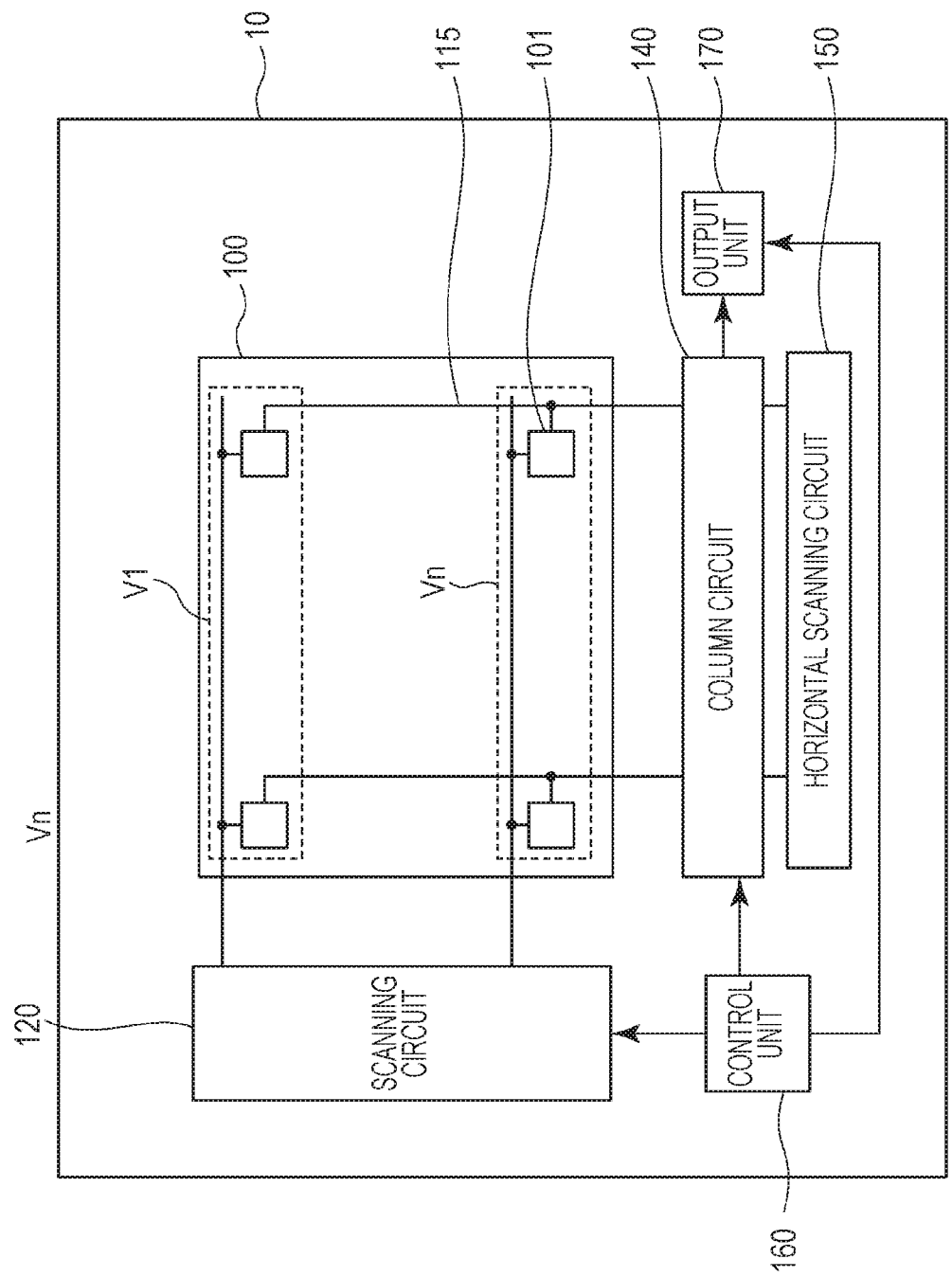
FIG. 1 is a block diagram of an image pickup apparatus.

Hereinafter, an image pickup apparatus according to the exemplary embodiments of the present invention will be described with reference to the drawings. Components having similar functions are assigned with the same reference numerals in the drawings. Furthermore, duplicated descriptions will be omitted in the exemplary embodiments.

First Exemplary Embodiment

With reference to FIG. 1 to FIG. 6, an image pickup apparatus 10 according to the present exemplary embodiment will be described. A configuration of the image pickup apparatus described with reference to FIG. 1 and FIG. 2 can also be applied to other exemplary embodiments.

FIG. 1 is a block diagram of the image pickup apparatus 10 according to the present exemplary embodiment. The image pickup apparatus 10 includes a pixel portion 100, a control unit 160, a vertical scanning circuit 120, a signal line 115, a column circuit 140, a horizontal scanning circuit 150, and an output unit 170.

The pixel portion 100 includes a plurality of pixels 101 configured to convert light into an electric charge signal and output the converted electric signal. The plurality of pixels 101 are arranged in a matrix.

The control unit 160 generates a control pulse. The vertical scanning circuit 120 receives the control pulse from the control unit 160 and supplies drive pulses to the respective pixel rows V1 to Vn. Control unit drive pulses include a drive pulse pTX for driving a transfer transistor that will be described below, a drive pulse pRES for driving a reset transistor, and a drive pulse pSEL for driving a selection transistor. The column circuit 140 includes an analog-to-digital (AD) conversion unit, and the AD conversion unit converts a pixel signal corresponding to an analog signal output from a unit pixel into a digital signal. The horizontal scanning circuit 150 outputs signals processed in parallel in the column circuit 140 to the output unit 170 for each column. It should be noted that the column circuit 140 may include an amplifier and a noise reduction circuit in addition to the above-described components.

Figure 2:
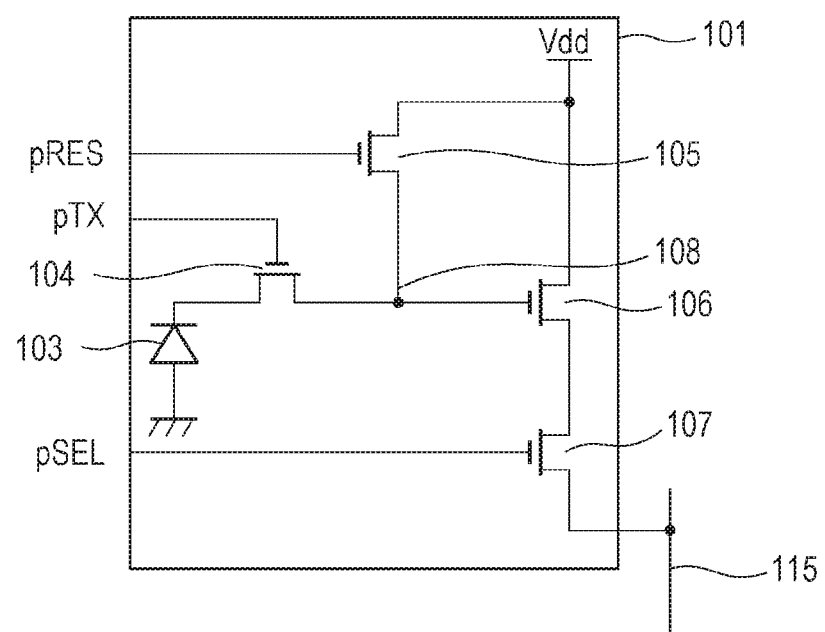
FIG. 2 is a circuit diagram of a pixel.

FIG. 2 illustrates an example of an equivalent circuit of a pixel. According to the present exemplary embodiment, electrons are used as signal charges, and descriptions will be given while each transistor is constituted by an N-type transistor. It should be however noted that holes may be used as the signal charges, and a P-type transistor may be used as the transistor of the pixel.

In addition, the equivalent circuit is not limited to this, and a part of the configuration may be in commonly used by a plurality of pixels.

The pixel 101 includes a photoelectric conversion unit 103, a transfer transistor 104, a reset transistor 105, an amplification transistor 106, a floating diffusion (hereinafter, will be referred to as an FD) 108, and a selection transistor 107.

The photoelectric conversion unit 103 generates an amount of electric charge pair in accordance with an incident light amount through photoelectric conversion and accumulates electrons. A photodiode is used as the photoelectric conversion unit 103, for example.

The transfer transistor 104 transfers the electrons accumulated in the photoelectric conversion unit 103 to the FD 108. A gate of the transfer transistor 104 is supplied with the drive pulse pTX, and an ON state and an OFF state are switched. The FD 108 holds the electrons transferred by the transfer transistor 104.

A gate of the amplification transistor 106 is connected to the FD 108. The amplification transistor 106 amplifies a signal based on the electrons transferred by the transfer transistor 104 to the FD 108 and outputs the amplified signal. More specifically, the electrons transferred to the FD 108 are converted into a voltage in accordance with its amount, and an electric signal in accordance with the voltage is output to the signal line 115 via the amplification transistor 106. The amplification transistor 106 constitutes a source follower circuit together with a current source that is not illustrated in the drawings.

The reset transistor 105 resets an electric potential of an input node of the amplification transistor 106. In addition, a reset operation is performed for resetting electric charges accumulated in the photoelectric conversion unit 103 (resetting the photoelectric conversion unit 103 at a predetermined electric potential) by overlapping an ON period of the reset transistor 105 with an ON period of the transfer transistor 104. A gate of the reset transistor 105 is supplied with the drive pulse pRES, and an ON state and an OFF state are switched. It should be however noted that the configuration is adopted herein in which the photoelectric conversion unit 103 is reset via the transfer transistor 104, but a configuration may also be adopted in which the reset transistor 105 is directly connected to the photoelectric conversion unit 103 to reset the photoelectric conversion unit 103.

The selection transistor 107 outputs signals of the plurality of pixels 101 arranged with respect to the one signal line 115 for one pixel each or a plurality of pixels each. A drain of the selection transistor 107 is connected to a source of the amplification transistor 106, and a source of the selection transistor 107 is connected to the signal line 115.

As an alternative to the configuration according to the present exemplary embodiment, the selection transistor 107 may be provided between a drain of the amplification transistor 106 and a power source line to which a power source voltage is supplied. The selection transistor 107 may be arranged in a manner that an electric conductive state between the amplification transistor 106 and the signal line 115 is controlled. A gate of the selection transistor 107 is supplied with the drive pulse pSEL, and an ON state and an OFF state of the selection transistor 107 are switched.

It should be noted that the selection transistor 107 may be omitted. In such a configuration, the source of the amplification transistor 106 is connected to the signal line 115 to switch an electric potential of the drain of the amplification transistor 106 or the gate of the amplification transistor 106 so that a selected state and a deselected state are switched. The same also applies to the following respective exemplary embodiments.

Figure 3:
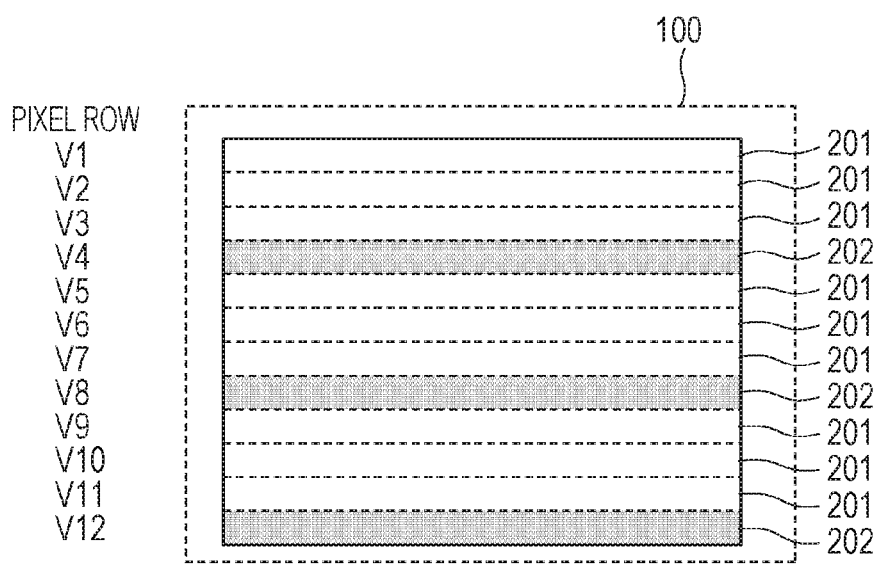
FIG. 3 is an explanatory diagram for describing a pixel portion.

Next, with reference to FIG. 3, the arrangement of the plurality of pixel rows V1 to Vn in the pixel portion 100 will be described. In FIG. 3, 12 pixel rows (V1 to V12) will be described as an example. In the pixel portion 100, a first pixel row in which pixels configured to obtain an image are arranged to form a row (hereinafter, will be referred to as an image pickup pixel row) 201 and a second pixel row in which pixels configured to obtain a signal for detecting a focus are arranged to form a row (hereinafter, will be referred to as a focus detection pixel row) 202 are arranged. The pixels configured to obtain the image are image pickup pixels, and the pixels configured to obtain the signal for detecting the focus are focus detection pixels. A plurality of image pickup pixel rows and a plurality of focus detection pixel rows are arranged. The plurality of image pickup pixel rows 201 constitute a first pixel group (hereinafter, will be referred to as an image pickup pixel group), and the plurality of focus detection pixel rows 202 constitute a second pixel group (hereinafter, will be referred to as a focus detection pixel group). According to the present exemplary embodiment, as illustrated in FIG. 3, the focus detection pixel row 202 is arranged so as to be adjacent to the image pickup pixel row 201. In addition, according to the present exemplary embodiment, the number of the focus detection pixel rows is lower than the number of the image pickup pixel rows, and the plurality of image pickup pixel rows (V5 to V7) are arranged between the two focus detection pixel rows (V4 and V8).

In FIG. 3, three pixel rows V4, V8, and V12 correspond to the focus detection pixel rows, and the other pixel rows correspond to the image pickup pixel rows. The image pickup pixel row is constituted by including the image pickup pixels, and the focus detection pixel row is constituted by including the focus detection pixels. The image pickup pixel row may also include pixels for a different purpose (for example, the focus detection pixels) in addition to the image pickup pixels, but in this case, the number of the image pickup pixels is higher than the number of the pixels for the different purpose. Similarly, the focus detection pixel row may also include pixels for a different purpose (for example, the image pickup pixels) in addition to the focus detection pixels, but in this case, the number of the focus detection pixels is higher than the number of the pixels for the different purpose.

One focus direction pixel corresponds to one micro lens, and a configuration in which the photoelectric conversion unit is divided into a plurality of regions (or a plurality of photoelectric conversion units are provided so as to correspond to one micro lens) or a configuration in which light is shielded in a part of the photoelectric conversion unit can be used. Phase difference detection type focus detection in related art can be performed by using signals of the focus detection pixels.

Figure 4:
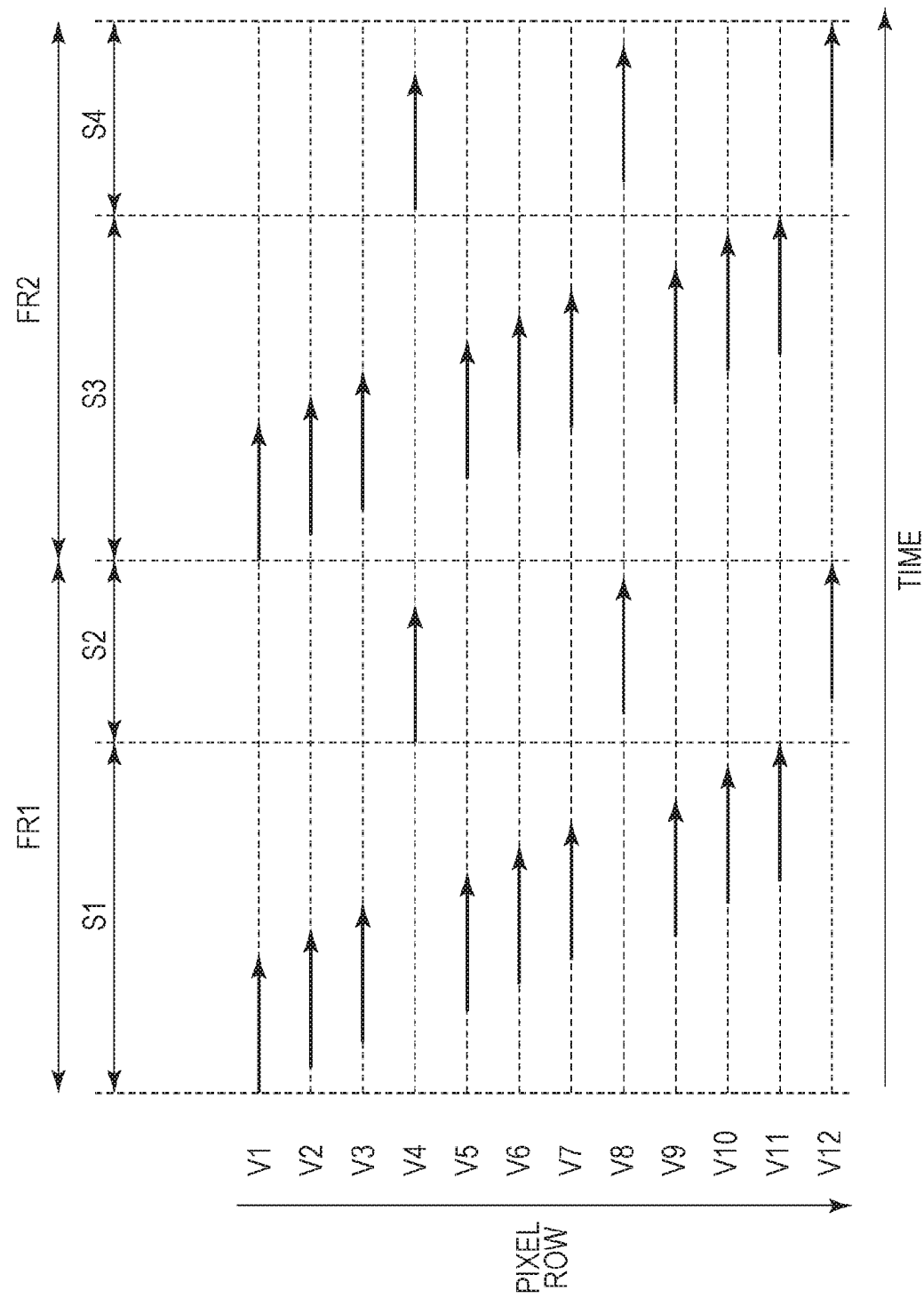
FIG. 4 is a reading sequence chart.

FIG. 4 illustrates signal reading sequences of the respective pixel groups illustrated in FIG. 3. In FIG. 4, a vertical direction represents numbers of pixel rows, and a horizontal direction represents time. The pixel rows are arranged in this state order of the numbers in plan view. According to the present exemplary embodiment, an electric charge accumulation period Ts is controlled by an electronic shutter operation in the pixel portion 100. According to the present exemplary embodiment, when focus is paid on a single pixel or a single pixel row, the electric charge accumulation period is started by reset of the photoelectric conversion unit of the pixel, and after an elapse of a predetermined period, the electric charge accumulation period is ended by transfer of the electric charges of the photoelectric conversion unit.

The electric charge accumulation period of each of the plurality of image pickup pixel rows is started by sequentially resetting the electric charges accumulated in the photoelectric conversion unit of the pixel in each of the image pickup pixel rows for each row. Then, the electric charge accumulation period of each of the plurality of image pickup pixel rows is ended by sequentially transferring the electric charges accumulated in the photoelectric conversion unit of the pixel in each of the image pickup pixel rows for each row.

On the other hand, the electric charge accumulation period of each of the plurality of focus detection pixel rows is started by sequentially resetting the electric charges accumulated in the photoelectric conversion unit of the pixel in each of the focus detection pixel rows for each row. Then, the electric charge accumulation period of each of the plurality of focus detection pixel rows is ended by sequentially transferring the electric charges accumulated in the photoelectric conversion unit of the pixel in each of the focus detection pixel rows for each row.

After the electric charge accumulation period is ended, the plurality of pixel rows are sequentially scanned for each row, and signals based on the electric charges generated in the photoelectric conversion units during the electric charge accumulation period are sequentially output to the signal line 115 for each pixel row. Hereinafter, a period from a time point when the electric charge accumulation period in a predetermined pixel row is ended until a time point when the output of the signal based on the electric charges generated in each of the photoelectric conversion units in the predetermined pixel row to the signal line 115 is ended will be referred to as an output period Top for the signals. A period indicated by a starting point and an ending point of an arrow in FIG. 4 represents a period obtained by combining the electric charge accumulation period Ts with the output period Top in each row.

In FIG. 4, a period including a start of the electric charge accumulation period in all the pixel rows constituting the pixel portion 100 and the end of the output period is set as one frame period. In a case where a plurality of frame periods are continuous, the respective periods are represented as a first frame period FR1 and a second frame period FR2. It should be noted that a frame period FR3 and subsequent frame periods are omitted in FIG. 4.

A first period S1 and a second period S2 are set in the first frame period (within FR1), and a third period S3 and a fourth period S4 are set in the second frame period (within FR2). The first period S1 and the third period S3 correspond to a period in which a read operation for the image pickup pixel group is performed while skipping the focus detection pixel row 202. The second period S2 and the fourth period S4 correspond to a period in which a read operation for the focus detection pixel group is performed, where the read operation is not performed in the first period S1 and the third period S3. While the above-described frame periods are repeated for a predetermined period so that it is possible to perform movie shooting.

The read operation described herein refers to an operation during a period from the start of an accumulation period Ts in a predetermined pixel row (more specifically, the start of reset period Tres) until the end of the output period Top. Therefore, in the example of FIG. 4, one frame period corresponds to a period from the start of the accumulation period Ts in all the pixel rows constituting the pixel portion 100 (more specifically, the start of the reset period Tres) until the end of the output period Top. The first period S1 and the third period S3 correspond to a period from the start of the accumulation period Ts in the plurality of first pixel rows (more specifically, the start of the reset period Tres) until the end of the output period Top. Similarly, the second period S2 and the fourth period S4 correspond to the start of the accumulation period Ts in the plurality of second pixel rows (more specifically, the start of the reset period Tres) until the end of the output period Top.

Figure 5:
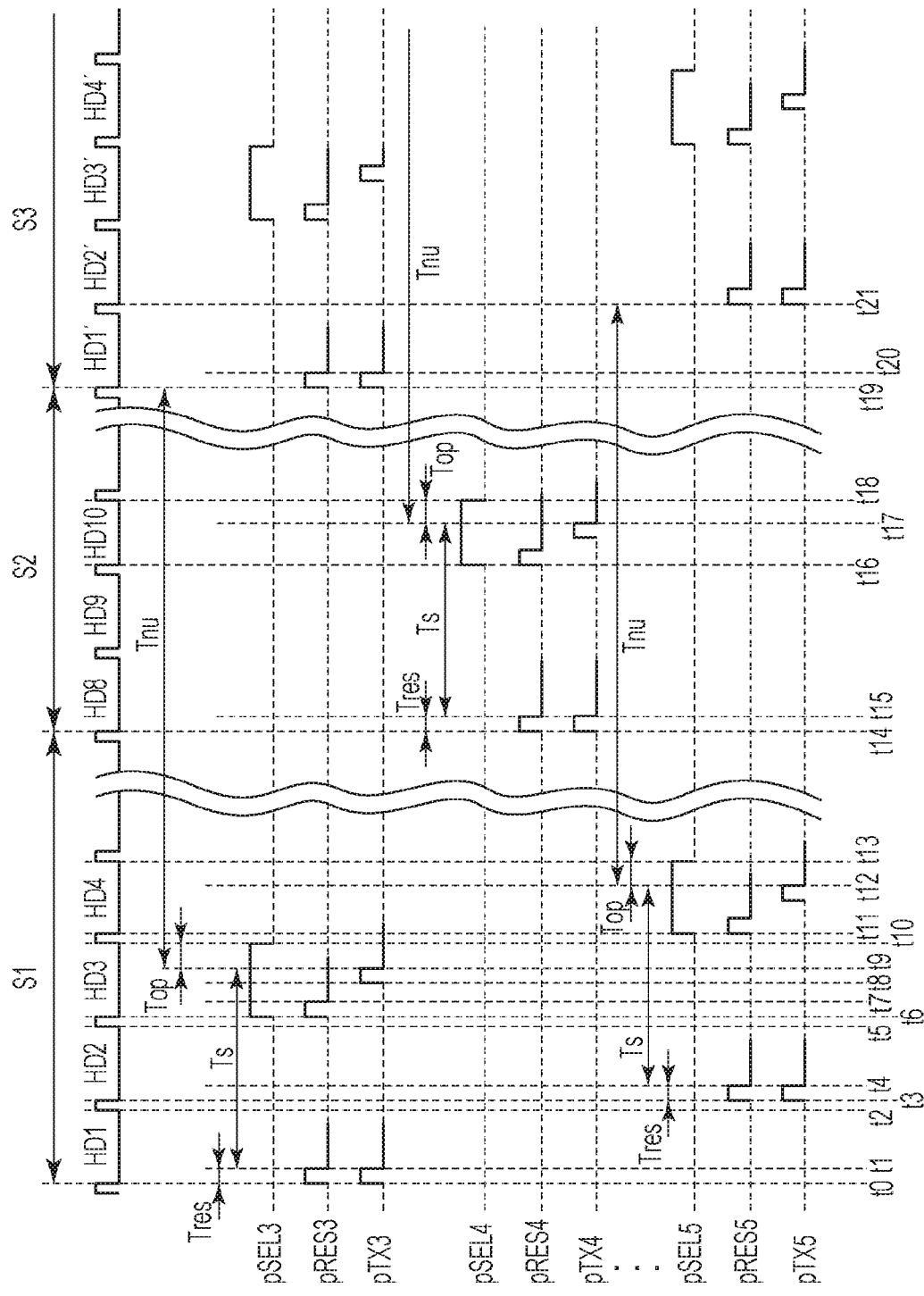
FIG. 5 is a driving timing chart for describing an issue.

In FIG. 5, parts where the image pickup pixel row 201 and the focus detection pixel row 202 are arranged to be adjacent to each other (the pixels rows V3 to V5 in FIG. 4) are extracted from the signal reading sequence for the pixel rows illustrated in FIG. 4, and an issue of the present exemplary embodiment will be described. A vertical direction in FIG. 5 represents drive pulses of the respective pixels rows V3 to V5, and a horizontal direction represents an elapse of time. A horizontal scanning period HD is set by a horizontal synchronous pulse. The selection transistor of the pixel 101 from which the signal read out from the image pickup apparatus during the horizontal scanning period HD is read out is put into an ON state during the horizontal scanning period HD.

In FIG. 5, the respective transistors are put into the ON state during a period in which the respective drive pulses are at a high level. During a period indicated by a solid line in the drive pulses of the respective transistors, the respective transistors in the pixel row are supplied with the respective drive pulses (pRES, pTX, and pSEL) from the vertical scanning circuit 120. The respective signals are not supplied from the vertical scanning circuit 120 during a period indicated by a broken line, which means that electric potentials of the respective control lines are held by parasitic capacitances. It should be however noted that the drive pulse may be supplied from the vertical scanning circuit 120 even during the period indicated by the broken line.

First, at a time t0, a first horizontal scanning period HD1 is started by the horizontal synchronous pulse. At this time, the drive pulse pRES3 and the drive pulse pTX3 in the pixel row V3 turns to the high level. Next, at a time t1, the drive pulse pRES3 and the drive pulse pTX3 turn to a low level. Accordingly, the photoelectric conversion unit 103 is reset, the electric charge accumulation period Ts of the photoelectric conversion unit 103 of each of the pixels constituting the pixel row V3 is started. That is, the time t1 is a starting time of the electric charge accumulation period Ts in the pixel row V3.

A period t0 to t1 corresponds to the reset period Tres in which the reset operation of the photoelectric conversion unit 103 is performed. Although not illustrated in FIG. 5, signals of the pixels in a predetermined pixel row (for example, the pixel row V1 in FIG. 4) may be output to an external part of the image pickup apparatus by the horizontal scanning circuit 150 during a part of the first horizontal scanning period HD1 in some cases. At a time t2, the first horizontal scanning period HD1 is ended.

At a time t3, a second horizontal scanning period HD2 is started. At this time, the drive pulse pRES5 and the drive pulse pTX5 in the pixel row V5 turn to the high level. Next, at a time t4, the drive pulse pRES5 and the drive pulse pTX5 turn to the low level. Accordingly, the photoelectric conversion unit 103 is reset, and the electric charge accumulation period Ts in the photoelectric conversion unit of the pixels in the pixel row V5 is started. That is, the time t4 corresponds to the starting time of the electric charge accumulation period Ts in the pixel row V5. At a time t5, the second horizontal scanning period HD2 is ended.

At a time t6, a third horizontal scanning period HD3 is started, and the drive pulses pSEL3 and pRES3 in the pixel row V3 turn to the high level. At a time t7, pRES3 turns to the low level. When the drive pulse pSEL3 turns to the high level, the selection transistor 107 is put into the ON state. In addition, the drive pulse pRES3 turns to the high level so that the FD is reset.

For this reason, the noise signal in the pixel row V3 is output to the signal line 115 during a period t7 to t8.

At a time t8, the drive pulse pTX3 turns to the high level, and at a time t9, the drive pulse pTX3 turns to the low level. With this operation, the electric charges accumulated in the photoelectric conversion unit 103 are transferred to the FD 108. A period t1 to t9 from the time t1 until the time t9 corresponds to the electric charge accumulation period Ts in the pixel row V3.

At a time t10, the drive pulse pSEL turns to the low level to be put into the OFF state, and the third horizontal scanning period HD3 is ended.

For this reason, the electric charges generated during the electric charge accumulation period Ts in the photoelectric conversion units constituting the respective pixels in the pixel row V3 are output to the signal line 115 during a period t9 to t10 from the time t9 until the time t10. Herein, the period t9 to t10 will be referred to as the output period Top.

It should be noted that, when differential processing for the signal output during the period t7 to t8 and the signal output during the period t9 to t10 is performed by the column circuit 140 or a correlated double sampling (CDS) circuit that is not illustrated in the drawing, it is possible to obtain the signal from which the noise is reduced.

During a period from the time t9 corresponding to the end of the electric charge accumulation period Ts until a time t19 corresponding to the start of the reset operation of the second frame period in the pixel row V3, a state is established in which the electric charges may be accumulated in the photoelectric conversion units 103 in the pixel row V3. However, during this period, since the electric charges accumulated in each of the photoelectric conversion units 103 in the pixel row V3 are not used for the signal output from the pixel row V3, this period is referred to as a null period Tnu of the pixels constituting the pixel row V3.

It should be noted that, after the reset period Tres in the pixel row V3, an electric charge accumulation operation in the pixel row V5 is started during the second horizontal scanning period HD2 corresponding to the next horizontal scanning period (the reset period Tres in the pixel row V5 occurs during the second horizontal scanning period HD2).

When the first period S1 (period of the read operation of the image pickup pixel group) is ended, the second period S2 (period of the read operation of the focus detection pixel group) is started from a time t14. During the second period S2, an operation similar to the read operation of the image pickup pixel group performed during the first period S1 which is described with reference to FIG. 5 is performed on the focus detection pixel group (the plurality of focus detection pixel rows V4, V8, and V12).

In this example, the image pickup pixel rows (V3, V5, V7, V9, and V11) and the focus detection pixel rows (V4, V8, and V12) are arranged so as to be adjacent to one another. The electric charge accumulation period of each of the image pickup pixel row and the focus detection pixel row arranged so as to be adjacent to each other is controlled in such a manner that, after the electric charge accumulation period of each of the photoelectric conversion units included in one pixel row is ended, the electric charge accumulation period of each of the photoelectric conversion units included in the other pixel row is started.

When the above-described signal reading sequence of the pixel portion 100 is performed, for example, the leakage of the electric charges from the pixel row V4 to the pixel rows V3 and V5 arranged so as to be adjacent to the pixel row V4 occurs during the first period S1. For this reason, an adverse influence such as noise may affect the signals output from the pixel rows (V3 and V5) arranged so as to be adjacent to the pixel row V4 to the signal line 115 in some cases.

It should be noted that, as in FIG. 4, the adverse influence becomes more prominent in a case where the other image pickup pixel rows (from V5 to V10) among the image pickup pixel rows are arranged between the pixel row V11 where the read operation is lastly performed (or the electric charge accumulation period Ts is lastly started) among the plurality of image pickup pixel rows (among the first pixel group) and the focus detection pixel row V4 where the read operation is firstly performed (or the electric charge accumulation period Ts is firstly performed) among the plurality of focus detection pixel rows (among the second pixel group). The adverse influence may often occur when the light reception amount is excessive with respect to the electric charge amount that can be accumulated in the photoelectric conversion unit 103, particularly in a case where an image of an object having a high luminance is obtained, a case where the null period Tnu is long with respect to the electric charge accumulation period Ts, or the like. The above-described phenomenon often occurs in a case where the electric charge accumulation period of each pixel is controlled by the electronic shutter operation. However, the adverse influence may occur in cases other than the case where the electronic shutter operation is performed as in a case where the image of the object having the high luminance is obtained or the like.

As illustrated in FIG. 4 and FIG. 5, the pixel row V4 (the focus detection pixel row) is put into the null period Tnu during the first period S1. For this reason, when the read operation of the pixel rows (the image pickup pixel rows) V3 and V5 adjacent to the pixel row (the focus detection pixel row) V4 is performed, the electric charges may be leaked from the pixels in the pixel row V4 to the pixels in the pixel rows V3 and V5, and the adverse influence may affect the signals read out from the pixel rows V3 and V5 in some cases.

Figure 6:
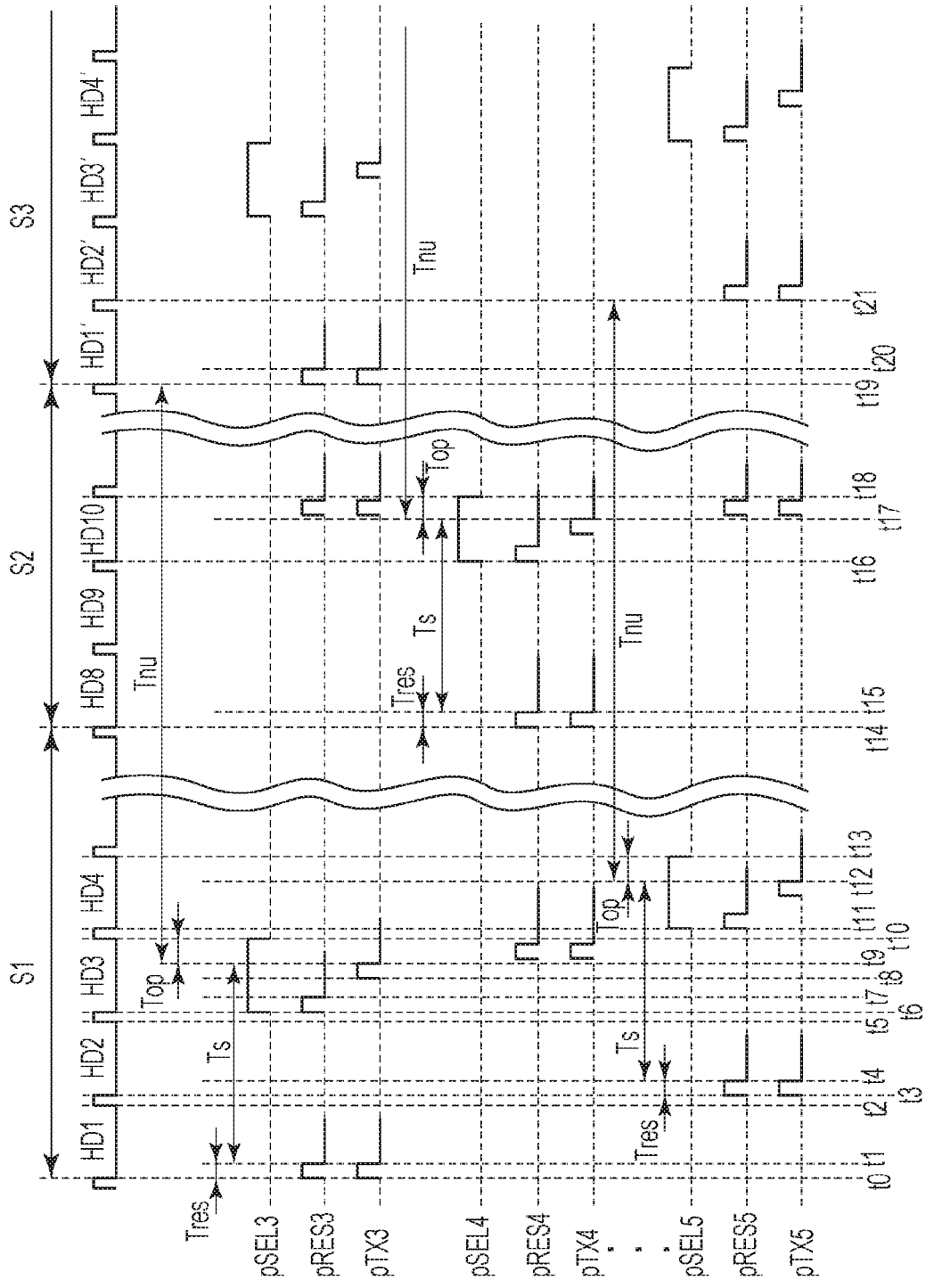
FIG. 6 is a driving timing chart according to a first exemplary embodiment.

FIG. 6 illustrates a driving timing according to the present exemplary embodiment. A difference from the driving timing of FIG. 5 resides in that the pixels in the pixel row V4 adjacent to the pixel row V3 are reset during the output period Top in the pixel row V3 (before the output period Top is ended). That is, in an example of FIG. 6, during a period from the start of the electric charge accumulation period in one pixel row among two adjacent pixel rows (V3 and V4, or V4 and V5) until the end of the output period Top, the respective photoelectric conversion units in the other pixel row are reset.

Specifically, at least one operation of the following three operations is performed according to a feature of the present exemplary embodiment.

The first operation is an operation for resetting the photoelectric conversion unit in the pixel row V4 during the output period Top (period t9 to t10) in the pixel row V3 (before the output period Top is ended). Specifically, the drive pulses pRES4 and pTX4 are set at the high level. Accordingly, it is possible to reduce the leakage of the electric charges from the pixel row V4 to the pixel row V3.

In particular, during the output period in the pixel row V3, the signals output from the respective pixels 101 constituting the pixel row V3 to the signal line 115 rely on the electric charges transferred to the FD 108. For this reason, it is possible to reduce the leakage of the electric charges from the photoelectric conversion unit in the pixel row V4 to the FD in the pixel row V3 by the above-described reset operation.

The second operation is an operation for resetting the photoelectric conversion unit in the pixel row V4 during the output period Top (period t12 to t13) in the pixel row V5 (before the output period Top is ended) (not illustrated). Specifically, the drive pulse pRES4 and pTX4 are set at the high level during the period t12 to t13. Accordingly, it is possible to reduce the leakage of the electric charges from the pixel row V4 to the pixel row V5.

The third operation is an operation for resetting the photoelectric conversion unit in one of the pixel rows V3 and V5 during the output period Top (period t17 to t18) in the pixel row V4 (before the output period Top is ended). Specifically, the drive pulses pRES3 and pTX3 or the drive pulses pRES5 and pTX5 are set at the high level during the period t17 to t18. Accordingly, it is possible to reduce the leakage of the electric charges from at least one of the pixel rows V3 and V5 to the pixel row V4.

Herein, in a case where the first operation is compared with the second operation, during the output period in the pixel row V3 where the read operation is previously performed, the reset in the pixel row V4 may be preferably performed. This is because the above-described effect can be accordingly caused in both the adjacent pixel rows V3 and V5. The same also applies to the following exemplary embodiments.

Furthermore, the above-described three operations may be performed, but only the first operation is more preferably performed. This is because the signal output from the focus direction pixel does not require a high accuracy as compared with the signal output from the image pickup pixel. A reason why the first operation is better than the second operation is as described above.

The reset operation according to the present exemplary embodiment can also be applied to the pixel rows V8 and V12 where the read operation is performed during the second period S2 as in the pixel row V4.

In addition, according to the present exemplary embodiment, the pixel group where the read operation is performed during the first period S1 and the third period S3 is set as the image pickup pixel group, and the pixel group where the read operation is performed during the second period S2 and the fourth period S4 is set as the focus detection pixel group, but an inverse configuration may also be adopted. That is, according to the present exemplary embodiment, either the first period or the second period set in one frame period may come first in an anteroposterior relationship, and the second period S2 may be set before or after the first period S1.

Moreover, according to the present exemplary embodiment, the read operation of the focus detection pixel group is performed after the read operation of the image pickup pixel group is performed, but the order is not limited to this stated order. For example, after the read operation of one pixel group may be performed plural times, the read operation of the other pixel group may be performed. In this case, for example, after the first period S1, the first period S1 occurs again during one frame, and thereafter, the second period S2 occurs.

Furthermore, according to the present exemplary embodiment, the example has been illustrated in which the pixels constituting the pixel portion 100 are the image pickup pixels and the focus direction pixels, but the effect described according to the present exemplary embodiment is attained even in a case where the pixels constituting the pixel portion 100 are only the image pickup pixels or only the focus direction pixels. For example, the above-described effect is attained by performing the reset operation according to the present exemplary embodiment also in a case where the pixel portion 100 is constituted by only the plurality of image pickup pixel rows, the read operation in predetermined pixel rows except for a part of pixel rows is performed during the first period S1, and the read operation in the part of the pixel rows is performed during the second period S2.

According to the present exemplary embodiment, during the output period Top in a certain pixel row, when a pixel row located to be adjacent to the certain pixel row corresponds to the null period Tnu, it is possible to reduce the influence such as noise on the signal output from the above-described certain pixel row to the signal line.

Second Exemplary Embodiment

Figure 7:
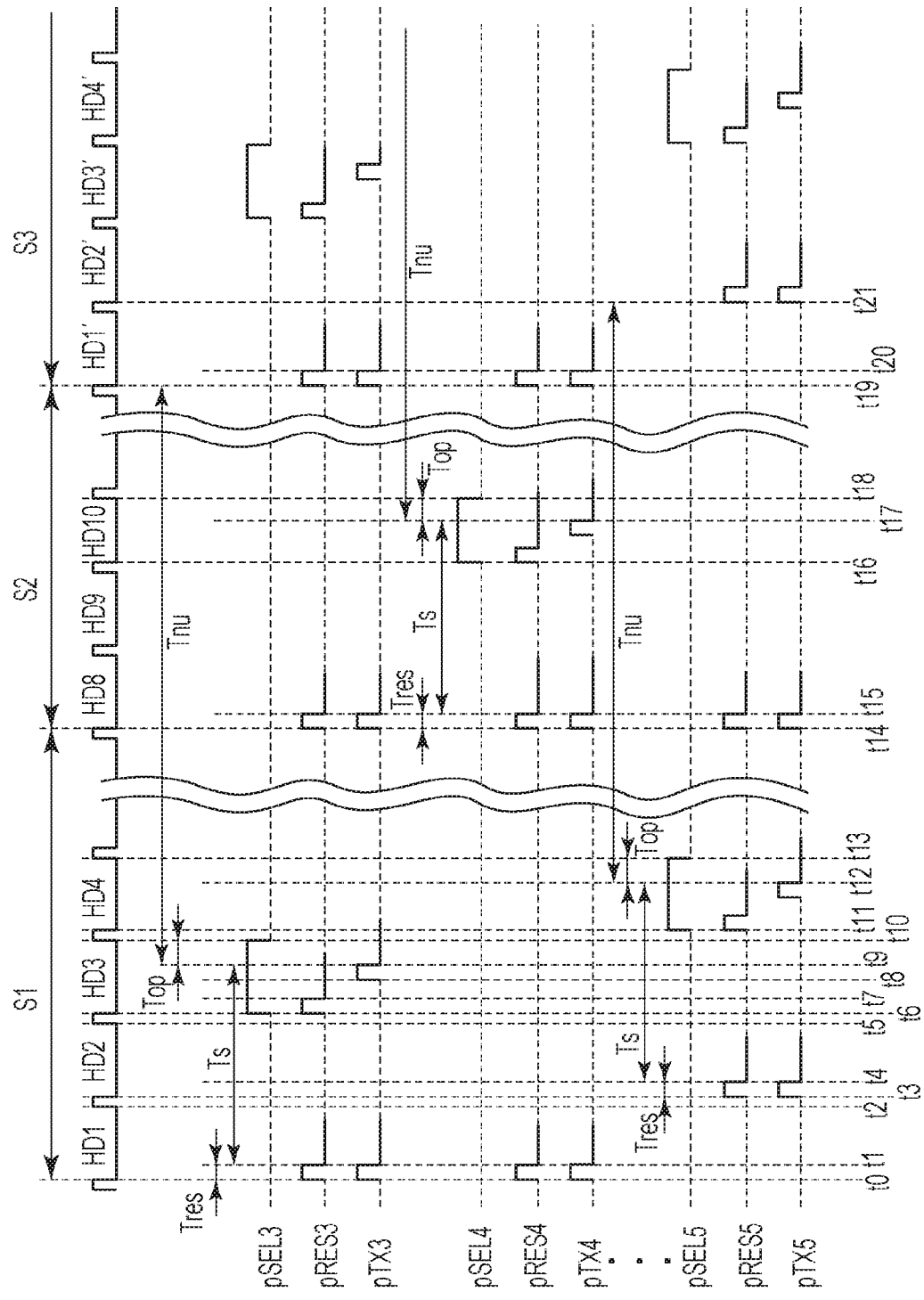
FIG. 7 is a driving timing chart according to a second exemplary embodiment.

With reference to FIG. 7, the image pickup apparatus according to the present exemplary embodiment will be described.

A difference between a driving timing according to the present exemplary embodiment illustrated in FIG. 7 and the driving timing illustrated in FIG. 6 according to the first exemplary embodiment resides in a timing when the reset operation is performed. According to the present exemplary embodiment, the photoelectric conversion unit in the focus detection pixel row V4 adjacent to the image pickup pixel row is reset at the same time as the reset operation that starts the electric charge accumulation period of the image pickup pixel row. Specifically, the drive pulses pRES4 and pTX4 the focus detection pixel row V4 are set at the high level during the period t0 to t1 corresponding to the reset period Tres in the image pickup pixel row V3.

Accordingly, the start of the electric charge accumulation period Ts in the pixel row V3 and the start of the null period Tnu in the pixel row V4 can be synchronous with each other. For this reason, it is possible to decrease a probability that the electric charges are leaked from the pixel row V4 to the pixel row V3 during the electric charge accumulation period Ts in the image pickup pixel row V3.

In addition, it is possible to reset at least one of the image pickup pixel rows V3 and V5 at the same time as the reset operation that starts the electric charge accumulation period Ts in the pixel row V4. Specifically, as illustrated in FIG. 7, the image pickup pixel rows V3 and V5 may be reset during the reset period Tres (period t14 to t15) in the pixel row V4.

According to the present exemplary embodiment, it is possible to attain the similar effects of the first exemplary embodiment. Furthermore, according to the present exemplary embodiment, the control signals pTX3 and pRES3 in the pixel row V3 adjacent to the pixel row V4 or the control signals pTX5 and pRES5 in the pixel row V5 adjacent to the pixel row V4 are used as the control signals pTX4 and pRES4 in the pixel row V4. Accordingly, the control unit 160 does not need to generate new control signals.

Third Exemplary Embodiment

Figure 8:
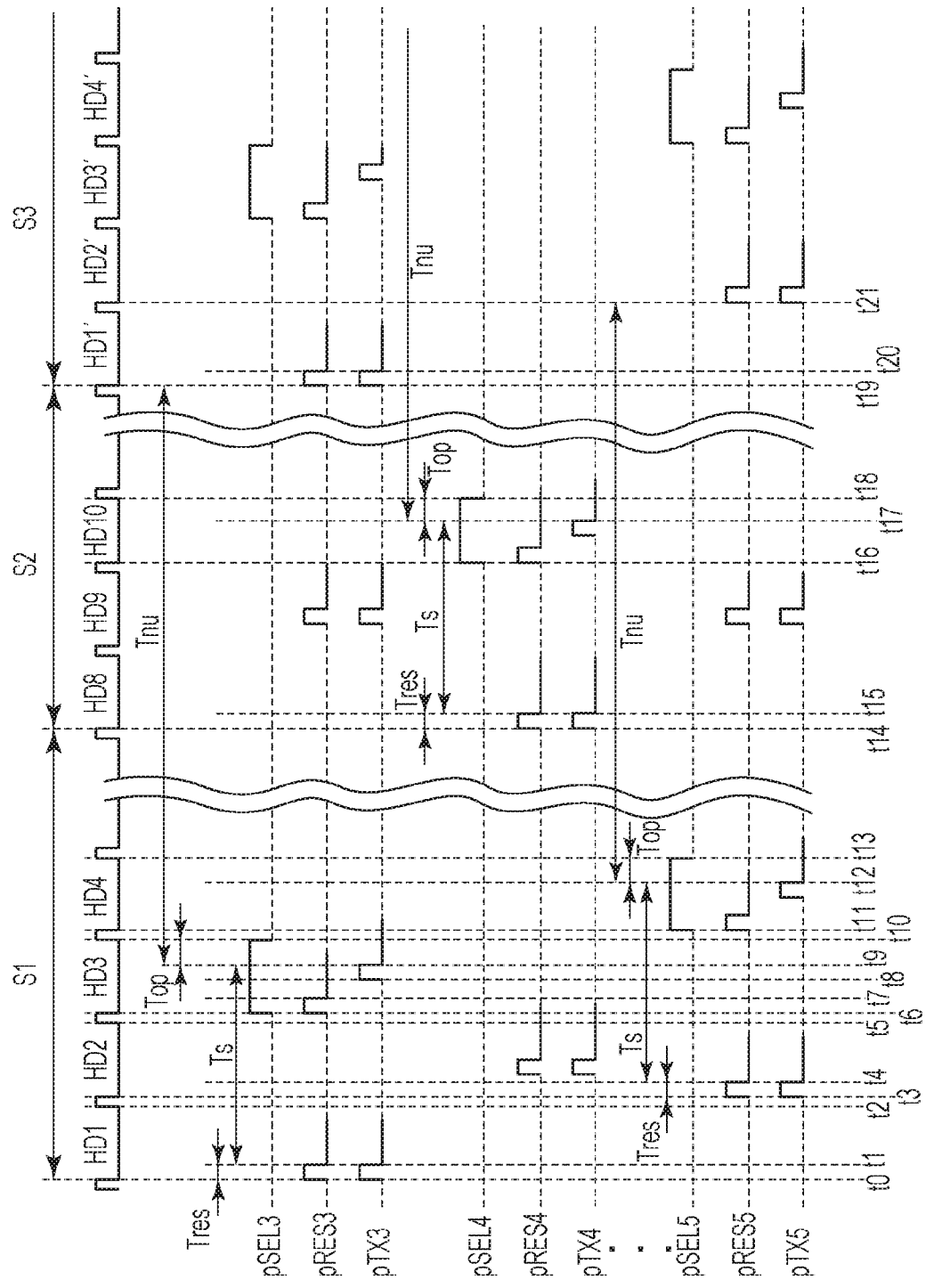
FIG. 8 is a driving timing chart according to a third exemplary embodiment.

With reference to FIG. 8, the image pickup apparatus according to the present exemplary embodiment will be described. A difference between a driving timing according to the present exemplary embodiment illustrated in FIG. 8 and the driving timing illustrated in FIG. 6 according to the first exemplary embodiment resides in that the photoelectric conversion unit in the focus detection pixel row V4 is reset during the electric charge accumulation period Ts in the image pickup pixel row V3 (period t1 to t9). According to the present exemplary embodiment too, it is possible to reduce the leakage of the electric charges from the pixels in the focus detection pixel row V4 to the pixels in the image pickup pixel row V3. In addition, similarly as in the above-described exemplary embodiment, the photoelectric conversion units in the image pickup pixel rows V3 and V5 may be reset during the electric charge accumulation period Ts in the focus detection pixel row (period t15 to t17). It should be noted that the reset operation is preferably performed at the same time on the photoelectric conversion units of the respective pixel rows in the image pickup pixel row V3 and the image pickup pixel row V5 during the electric charge accumulation period Ts in the focus detection pixel row.

According to the present exemplary embodiment too, it is possible to attain the similar effects of the above-described exemplary embodiment.

Fourth Exemplary Embodiment

Figure 9:
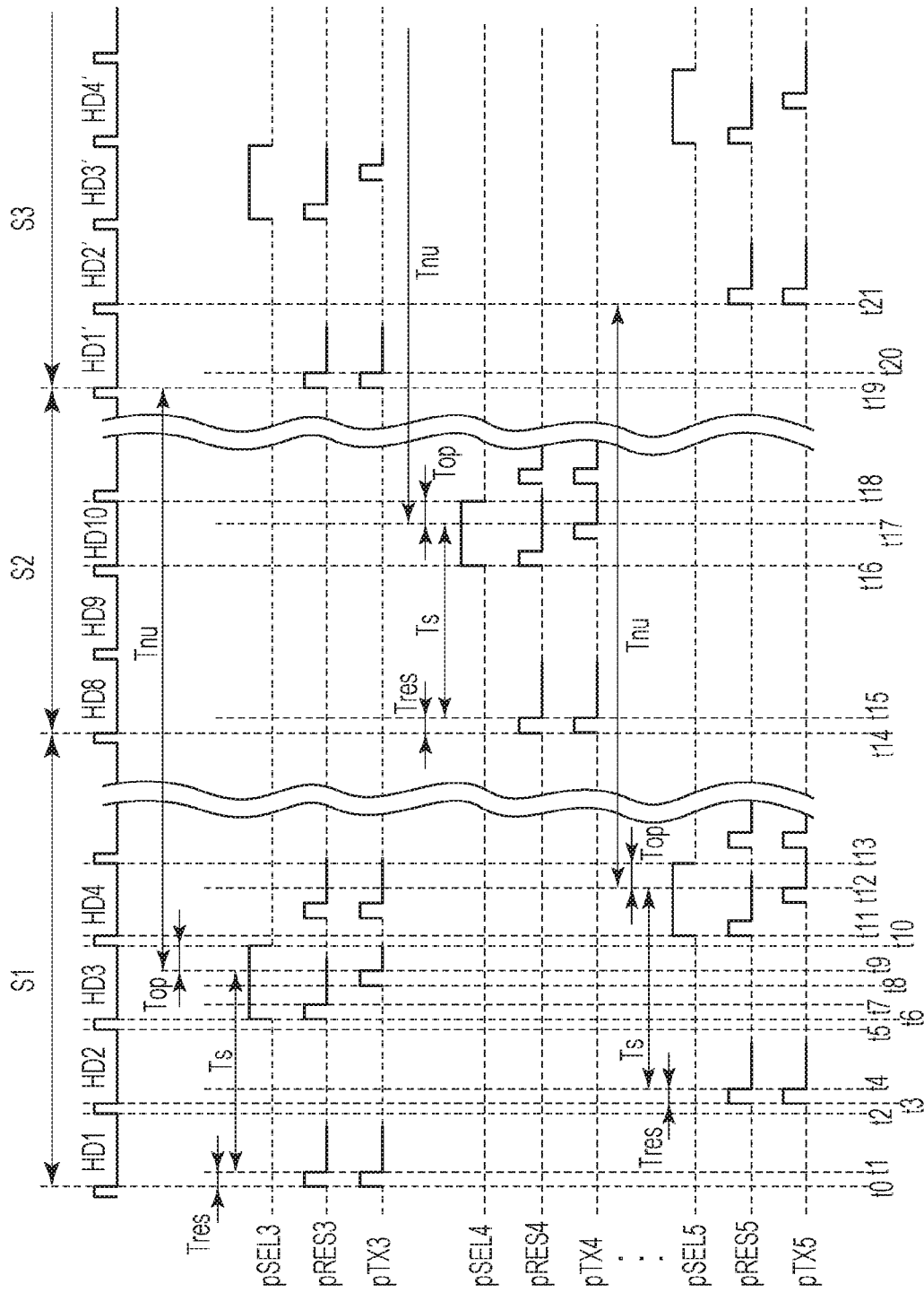
FIG. 9 is a driving timing chart according to a fourth exemplary embodiment.

With reference to FIG. 9, the image pickup apparatus according to the present exemplary embodiment will be described.

A difference between the driving timing illustrated in FIG. 9 according to the present exemplary embodiment and the driving timing illustrated in FIG. 6 according to the first exemplary embodiment resides in a timing for performing the reset operation. Specifically, the difference resides in that the photoelectric conversion unit in the pixel row V4 is reset during at least a part of a period from a time t18 corresponding to the end of the output period Top in the focus detection pixel row V4 until the time t19 corresponding to the start of the reset period Tres in the image pickup pixel row V3. According to the present exemplary embodiment too, the leakage of the electric charges from the pixels in the focus detection pixel row V4 to the pixels in the image pickup pixel row V3 can be reduced. The photoelectric conversion unit in the pixel row V3 may be reset during at least a part of a period from the time t10 corresponding to the end of the output period Top in the image pickup pixel row V3 until the time t14 corresponding to the start of the reset period Tres in the focus detection pixel row V4. Furthermore, the photoelectric conversion unit in the pixel row V5 may be reset during at least a part of a period from a time t13 corresponding to the end of the output period Top in the image pickup pixel row V5 until the time t14 corresponding to the start of the reset period Tres in the focus detection pixel row V4.

According to the present exemplary embodiment too, it is possible to attain the similar effects of the first exemplary embodiment.

Fifth Exemplary Embodiment

Figure 10:
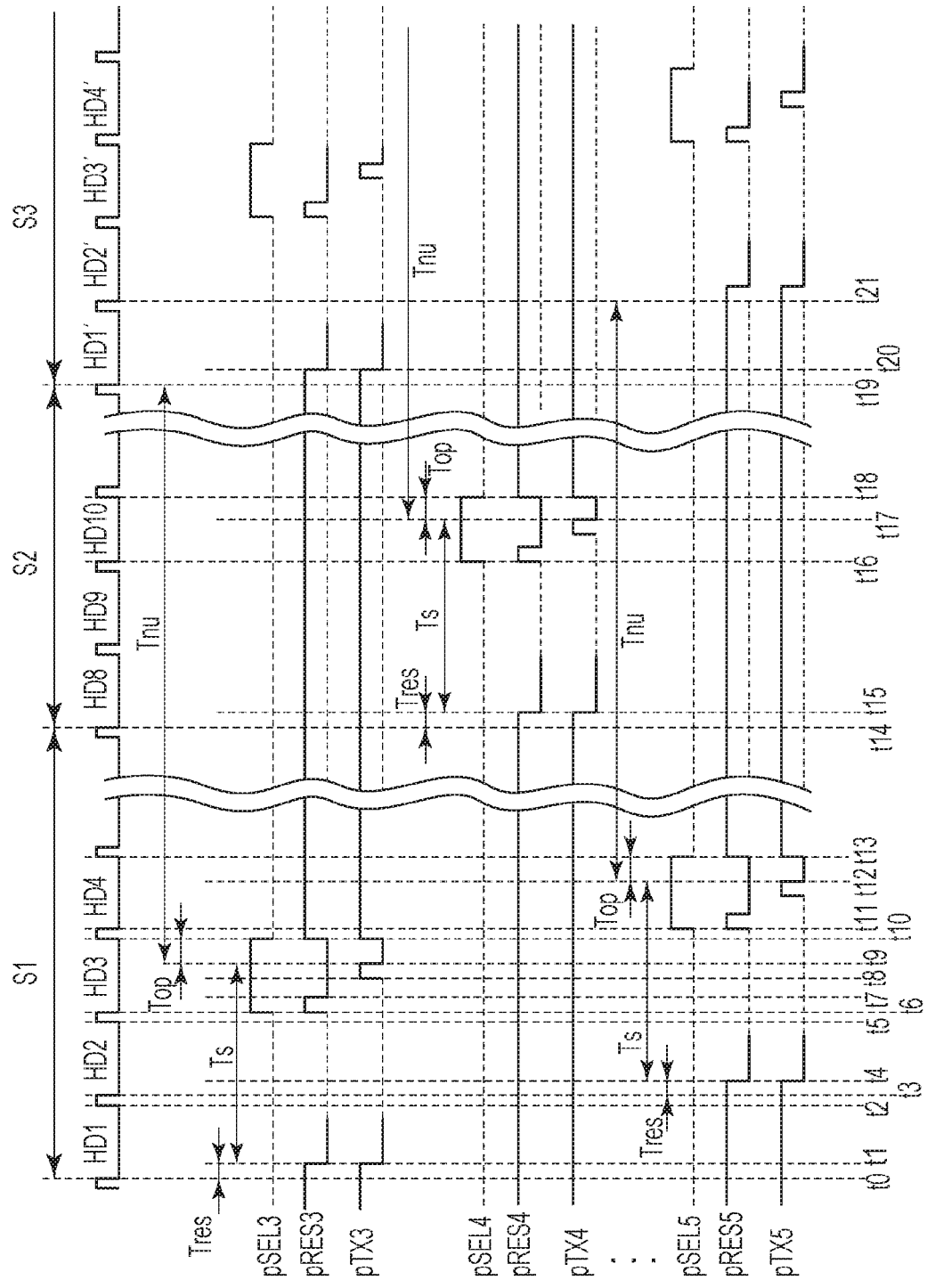
FIG. 10 is a driving timing chart according to a fifth exemplary embodiment.

With reference to FIG. 10, the image pickup apparatus according to the present exemplary embodiment will be described.

A difference between the driving timing illustrated in FIG. 10 according to the present exemplary embodiment and the driving timing illustrated in FIG. 6 according to the first exemplary embodiment resides in that the photoelectric conversion unit in the pixel row V4 is kept to be reset during all periods except for the electric charge accumulation period Ts and the output period Top in the focus detection pixel row V4. According to the present exemplary embodiment, since majority of the electric charges generated during the null period Tnu in the pixel row V4 is reset, the leakage of the electric charges to the pixel rows V3 and V5 adjacent to the pixel row V4 can be reduced as compared with the above-described exemplary embodiment.

Furthermore, according to the present exemplary embodiment, as illustrated in FIG. 10, an operation similar to the above-described reset operation performed on the pixel row V4 may also be performed on the image pickup pixel rows V3 and V5.

Sixth Exemplary Embodiment

Figure 11:
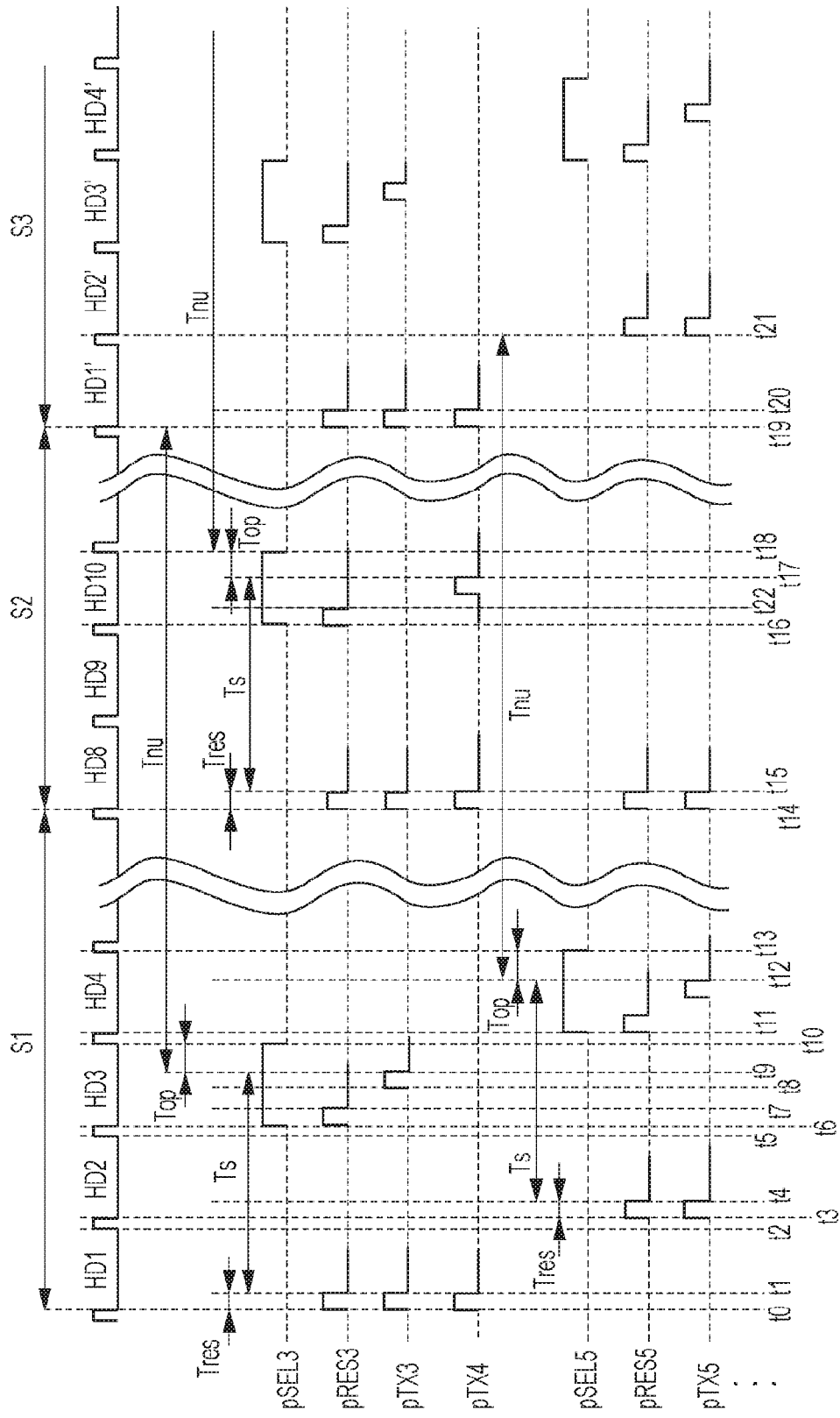
FIG. 11 is a driving timing chart according to a sixth exemplary embodiment.

As a driving timing of the present exemplary embodiment, FIG. 11 illustrates a modified example of the driving timing of FIG. 7. Herein, FIG. 7 is used as an example, but drawings other than FIG. 7 may also be used. Descriptions with regard to driving similar to the driving timing chart of FIG. 7 will be omitted.

According to the present exemplary embodiment, the pixel in the image pickup pixel row V1 and the pixel in the image pickup pixel row V2 illustrated in FIG. 3 use the common FD 108. The pixel in the image pickup pixel row V3 and the pixel in the focus detection pixel row V4 use the common FD 108. Two pixels in the following pixel rows in a subsequent turn also use the common FD 108. Therefore, the pixel in a part of the plurality of image pickup pixels and the pixel in the focus detection pixel row use the common FD 108.

With regard to the pixels in the other part of the plurality of image pickup pixel rows (for example, V1), the mutual pixels in the image pickup pixel rows use the common FD. In addition to the above, a configuration may also be adopted in which the pixel in a part of the image pickup pixel row and a pixel in a pixel row for a purpose other than the image pickup or the focus detection use the common FD 108.

According to the present exemplary embodiment, the pixels that use the common FD 108 commonly use the reset transistor 105, the amplification transistor 106, and the selection transistor 107. For this reason, the reset operation in the image pickup pixel row V3 and the focus detection pixel row V4 is controlled by the drive pulses pSEL3 and pRES3.

During a period t7 to t10 from the time t7 when the drive pulse pRES3 that resets the FD in the image pickup pixel rows V3 and V4 is turned OFF until the time t10 when the output period Top is ended in the first period S1, the signal in the focus detection pixel row V4 is not output to the FD 108 by turning the drive pulse pTX4 OFF.

Accordingly, the signal in the focus detection pixel row V4 is suppressed to be mixed when the noise signal in the image pickup pixel row V3 is output or when the signal in the image pickup pixel row V3 is output. Herein, the descriptions have been made while the first period is used as an example. A similar effect can be attained by turning pRES3 OFF during a period t22 to t18 in the second period S2.

It should be noted that, according to the present exemplary embodiment, in a case where a time when the drive pulse pTX4 or pTX3 is turned OFF from ON and a time when the reset operation of the FD 108 is ended which is closest to the output period in which the signals from the pixels in a part of the respective pixel rows during each of the periods are output are the same time in the first period S1 and the second period S2, an electric potential of the FD 108 fluctuates by a coupling capacitance of the gate of the transfer transistor 104 and the FD 108 and return electric charges generated when the transfer transistor 104 is turned OFF, and noise may be generated.

In view of the above, in the first period S1 and the second period S2, the time when the drive pulse pTX4 or pTX3 is turned OFF from ON is preferably set to be ahead of the time when the reset operation of the FD 108 is ended which is closest to the output period in which the signals from the pixels in the part of the respective pixel rows are output during each of the periods.

Preferably, the operation for turning the drive pulse pTX4 or pTX3 OFF from ON is not performed during the horizontal scanning period HD including the time when the reset operation of the FD 108 is ended which is closest to the output period in which the signals from the pixels in the part of the respective pixel rows are output in the first period S1 and the second period S2. In this case, for example, the above-described operation is performed during the previous horizontal scanning period HD before the above-described horizontal scanning period HD. Accordingly, it is possible to suppress the noise generated when the electric potential of the FD fluctuates.

Figure 12:
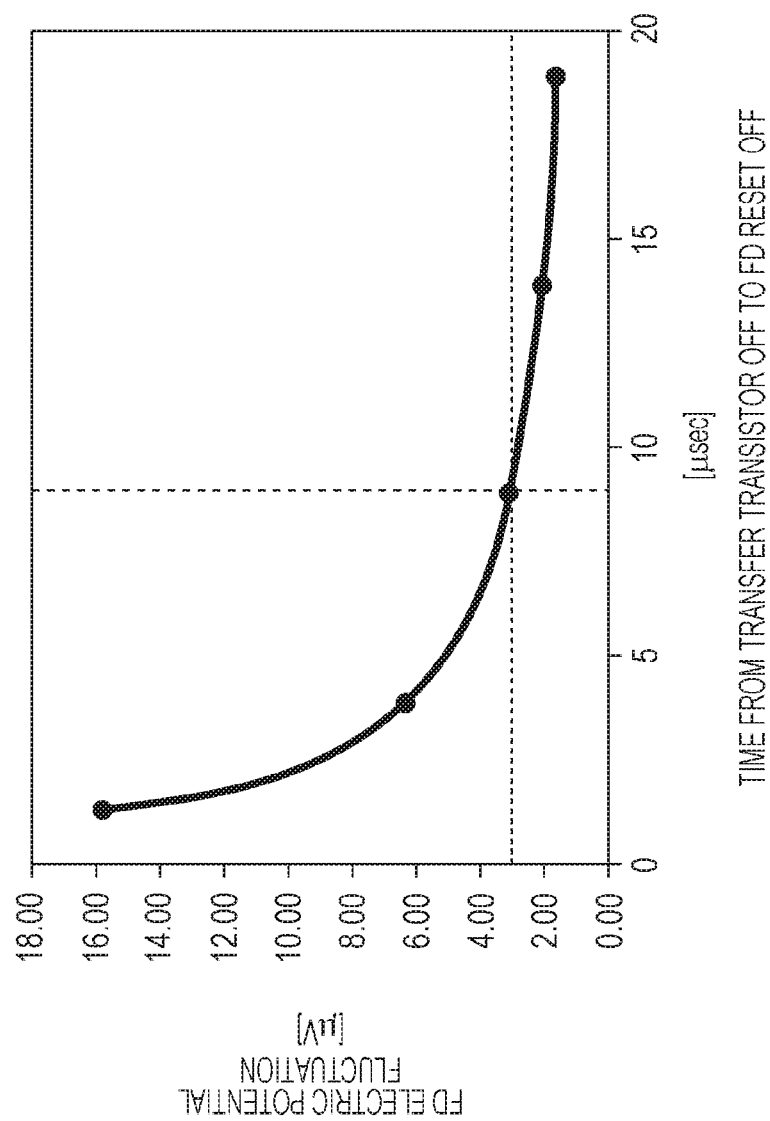
FIG. 12 illustrates an electric potential fluctuation of an FD according to the sixth exemplary embodiment.

As an alternative to the above, in a case where the capacitance of the FD is 3 fF to 6 fF, as illustrated in FIG. 12, before 9 μsec or longer elapse from the time when the reset operation of the FD 108 is ended which is closest to the output period in which the signals from the pixels in the part of the respective pixel rows are output, the operation for turning the drive pulse pTX4 or pTX3 OFF from ON is not performed in the first period S1 and the second period S2. According to the above-described configuration, the electric potential fluctuation of the FD 108 which is caused by turning the drive pulse pTX4 or pTX3 OFF is suppressed. Accordingly, kTC noise included in the output signal can be suppressed.

The present invention has been described above by ways of the specific exemplary embodiments, but the present invention is not limited to the respective exemplary embodiments, and modifications and combinations can be appropriately made within the concept.

The mutually different reset periods are set according to the first to fourth exemplary embodiments, but the respective reset periods may be appropriately combined with each other to be carried out.

In addition, since the reset operation is sequentially performed for each pixel row according to the respective exemplary embodiments, the signal is read out by a rolling shutter operation in which the electric charge accumulation period differs for every pixel row. However, a global electronic shutter operation in which the electric charge accumulation periods are set to be the same may be performed. An operation in which the electric charge accumulation periods differs for every plural pixel rows may be performed instead.

In the global electronic shutter operation, for example, the starting times of the accumulation period Ts in all the image pickup pixel rows may be set to be the same, and also the ending times of the accumulation period Ts in all the image pickup pixel rows may be set to be the same. In addition, with regard to the focus detection pixel row too, the starting times of the accumulation period Ts in all the focus detection pixel rows may be set to be the same, and the ending times of the accumulation period Ts may be set to be the same during a period different from (period that is not overlapped with) the accumulation period Ts in the image pickup pixel row.

Moreover, according to the above-described respective exemplary embodiments, the example has been illustrated in which the single focus detection pixel row (V4) is arranged between the two image pickup pixel rows (V3 and V5), but a plurality of focus detection pixel rows (V4) can also be arranged between the two the image pickup pixel rows (V3 and V5).

Furthermore, a position of the focus detection pixel row is not particularly limited as long as the focus detection pixel row is adjacent to at least one of the image pickup pixel rows. For example, a mode may be adopted in which one or a plurality of focus detection pixel rows are arranged at farthest ends of the pixel portion 100 without being arranged between the two image pickup pixel rows (V3 and V5). For example, in a case where n pixel rows (V1 to Vn) are arranged in the pixel portion 100, the pixel row V1 and/or the pixel row Vn may be set as the focus detection pixel rows. Furthermore, for example, the pixel row V1 to the pixel row V5 and/or the pixel row Vn−4 to the pixel row Vn may be set as the focus detection pixel rows. In addition, according to the above-described respective exemplary embodiments, the image pickup pixel group and the focus detection pixel group are set as the combination of the respective pixel groups, but the configuration is not limited to this. For example, the focus detection pixel group may be replaced by a pixel group configured to detect a temperature or a pixel group configured to detect near infrared ray.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-254582 filed Dec. 16, 2014 and No. 2015-229180 filed Nov. 24, 2015, which are hereby incorporated by reference herein in their entirety.

What is claimed is:

1. A driving method for an image pickup apparatus including a plurality of pixel rows constituting a first pixel group including a plurality of first pixel rows and a second pixel group including a plurality of second pixel rows, each pixel row including a plurality of pixels, and each pixel including a photoelectric conversion unit, the driving method comprising:

controlling a first period from a start of a reset operation, to be performed on photoelectric conversion units in a first pixel row among the plurality of first pixel rows, for starting an electric charge accumulation period in the photoelectric conversion units in the first pixel row until an end of reading of signals based on the electric charges in the respective photoelectric conversion units in the first pixel row from the first pixel row and a second period from a start of reset operation, to be performed on photoelectric conversion units in a second pixel row among the plurality of second pixel rows, for starting an electric charge accumulation period in the photoelectric conversion units in the second pixel row, the second pixel row being arranged adjacent to the first pixel row until an end of reading of signals based on the electric charges in the respective photoelectric conversion units in the second pixel row from the second pixel row during one frame period in a manner that the second period is started after the first period is ended; and resetting the respective photoelectric conversion units in the second pixel row during the first period before the reading of the signals from the first pixel row is ended, wherein the first pixel row includes an image pickup pixel, and the second pixel row includes a focus detection pixel.

2. The driving method according to claim 1, wherein the accumulation of the electric charges in the plurality of first pixel rows is started by sequentially resetting the electric charges accumulated in the photoelectric conversion units of the pixels in the respective first pixel rows for each row and is ended by sequentially transferring the electric charges accumulated in the photoelectric conversion units of the pixels in the respective first pixel rows for each row, and wherein the accumulation of the electric charges in the plurality of second pixel rows is started by sequentially resetting the electric charges accumulated in the photoelectric conversion units of the pixels in the respective second pixel rows for each row and is ended by sequentially transferring the electric charges accumulated in the photoelectric conversion units of the pixels in the respective second pixel rows for each row.

3. The driving method according to claim 2, wherein the photoelectric conversion units of the pixels in the second pixel row adjacent to the first pixel row are reset at the same time when a reset operation for starting the accumulation of the electric charges in the first pixel row is performed.

4. The driving method according to claim 2, wherein the photoelectric conversion units of the pixels in the second pixel row adjacent to the first pixel row are reset during at least a part of a period from the end of the accumulation of the electric charges in the first pixel row until the end of the reading of the signals in the first pixel row.

5. The driving method according to claim 2, wherein the photoelectric conversion units of the pixels in the second pixel row are reset during a period from the end of the reading of the signals from the second pixel row until the start of the accumulation of the electric charges in the first pixel row.

6. The driving method according to claim 2, wherein the photoelectric conversion units of the pixels in the second pixel row are kept to be reset during a period except for a period from the start of the accumulation of the electric charges in the second pixel row until the end of the reading of the signals from the second pixel row.

7. The driving method according to claim 1, wherein the photoelectric conversion units of the pixels in the second pixel row are reset during the entire first period.

8. The driving method according to claim 1, wherein the plurality of second pixel rows are fewer than the plurality of first pixel rows.

9. The driving method according to claim 8, wherein another pixel row among the plurality of first pixel rows is arranged between a pixel row where the accumulation of the electric charges is lastly started among the plurality of first pixel rows and a pixel row where the accumulation of the electric charges is firstly started among the plurality of second pixel rows during the one frame period.

10. The driving method according to claim 9, wherein at least a part of pixel rows among the plurality of first pixel rows is arranged between one pixel row and another pixel row among the plurality of second pixel rows.

11. The driving method according to claim 10, wherein the accumulation of the electric charges in the respective photoelectric conversion units in the plurality of first pixel rows is sequentially started for each row, and the accumulation of the electric charges in the respective photoelectric conversion units in the plurality of second pixel rows is sequentially started for each row.

12. An image pickup apparatus comprising:

a plurality of pixel rows, each pixel row including a plurality of pixels, and each pixel including a photoelectric conversion unit; and a control unit, wherein the control unit controls a first period from a start of accumulation of electric charges in respective photoelectric conversion units in a first pixel row until an end of reading of signals based on the electric charges in the respective photoelectric conversion units in the first pixel row from the first pixel row and a second period from a start of accumulation of electric charges in respective photoelectric conversion units in a second pixel row arranged to be adjacent to the first pixel row until an end of reading of signals based on the electric charges in the respective photoelectric conversion units in the second pixel row from the second pixel row during one frame period in a manner that the second period is started after the first period is ended, and resets the respective photoelectric conversion units in the second pixel row during the first period before the reading of the signals from the first pixel row is ended.

13. The image pickup apparatus according to claim 12, wherein the plurality of pixel rows include the plurality of first pixel rows and the plurality of second pixel rows fewer than the first pixel rows, and wherein one pixel row among the plurality of first pixel rows is arranged to be adjacent to each of the plurality of second pixel rows.

14. The image pickup apparatus according to claim 13, wherein another pixel row among the plurality of first pixel rows is arranged between a pixel row where the accumulation of the electric charges is lastly started among the plurality of first pixel rows and a pixel row where the accumulation of the electric charges is firstly started among the plurality of second pixel rows during the one frame period.

15. The image pickup apparatus according to claim 12, wherein each of the plurality of pixels includes a floating diffusion, and wherein a part of the pixels in the plurality of first pixel rows and a part of the pixels in the plurality of second pixel rows commonly use the floating diffusion.

16. The driving method according to claim 2, wherein the photoelectric conversion units in the second pixel row adjacent to the first pixel row is reset during at least a part of a period from the start of the electric charge accumulation period in the first pixel row until the end of the electric charge accumulation period in the first pixel row.

17. The driving method according to claim 1, wherein each of the plurality of pixels includes a floating diffusion, and wherein a part of the pixels in the first pixel row and a part of the pixels in the second pixel row use the common floating diffusion.

18. The driving method according to claim 8,
wherein each of the plurality of pixels includes an amplification transistor configured to amplify signals based on the electric carriers accumulated in the floating diffusion; and
a selection transistor configured to control an electric conductive state between the amplification transistor and a signal line,
wherein the selection transistor of a pixel included in a predetermined pixel row is in an ON state during a horizontal scanning period which starts when the selection transistor turns on, and ends when the selection transistor turns off, and
wherein reset of the photoelectric conversion units in the second pixel row is performed during a horizontal period that is one or more periods before a horizontal period including an output period during which a signal is output from the first pixel row, and reset of the photoelectric conversion units in the second pixel row is not performed during the horizontal period including the output period during which the signal is output from the first pixel row.

19. The driving method according to claim 1,
wherein each of the plurality of pixels includes a reset transistor, and
wherein, for each of the photoelectric conversion units included in the second pixel row, a photoelectric conversion unit is reset while a reset transistor included therein is in an ON state.

20. The image pickup apparatus according to claim 12, wherein the first pixel row includes an image pickup pixel, and the second pixel row includes a focus detection pixel.

* * * * *